(12) United States Patent
Han

(10) Patent No.: US 7,564,728 B2
(45) Date of Patent: Jul. 21, 2009

(54) SEMICONDUCTOR MEMORY DEVICE AND ITS DRIVING METHOD

(75) Inventor: Hi-Hyun Han, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 11/477,392

(22) Filed: Jun. 30, 2006

(65) Prior Publication Data

US 2007/0070746 A1 Mar. 29, 2007

(30) Foreign Application Priority Data

Sep. 29, 2005 (KR) .................. 10-2005-0091675
Dec. 29, 2005 (KR) .................. 10-2005-0134012

(51) Int. Cl.
*G11C 7/12* (2006.01)

(52) U.S. Cl. ............... 365/203; 365/226; 365/227; 365/189.09

(58) Field of Classification Search .............. 365/189, 365/203, 226, 189.09
See application file for complete search history.

(56) References Cited

U.S. PATENT DOCUMENTS

| | | | | |
|---|---|---|---|---|
| 5,124,585 | A | * | 6/1992 | Kim et al. .................. 326/87 |
| 5,267,214 | A | * | 11/1993 | Fujishima et al. ....... 365/230.03 |
| 5,828,614 | A | | 10/1998 | Gradinariu |
| 5,877,993 | A | * | 3/1999 | Biegel et al. ................. 365/201 |
| 6,058,061 | A | * | 5/2000 | Ooishi ........................ 365/222 |
| 6,097,648 | A | | 8/2000 | Bessho et al. |
| 6,519,198 | B2 | * | 2/2003 | Suematsu et al. ........... 365/205 |
| 7,123,529 | B1 | * | 10/2006 | Hanson et al. ............. 365/205 |
| 2002/0080667 | A1 | * | 6/2002 | Tanaka et al. ............... 365/201 |
| 2003/0123311 | A1 | * | 7/2003 | Park .......................... 365/203 |
| 2004/0052146 | A1 | | 3/2004 | Sim |
| 2005/0232042 | A1 | | 10/2005 | Kim et al. |

FOREIGN PATENT DOCUMENTS

| | | |
|---|---|---|
| JP | 4-214294 A | 8/1992 |
| JP | 10-289586 A | 10/1998 |
| JP | 10-302472 A | 11/1998 |
| JP | 2004-288299 A | 10/2004 |
| KR | 2001-0001739 | 1/2001 |
| KR | 2003-0058287 | 7/2003 |
| KR | 2004-0011054 | 2/2004 |
| KR | 2005-0029886 | 3/2005 |
| KR | 2005-0101893 | 10/2005 |

OTHER PUBLICATIONS

Takashima and Nakano, "A Cell Transistor Scalable DRAM Array Architecture", IEEE, IEEE Journal of Solid-State Circuits, vol. 37, No. 5, May 2002, pp. 587-591.*

* cited by examiner

*Primary Examiner*—Hoai V Ho
*Assistant Examiner*—Jay Radke
(74) *Attorney, Agent, or Firm*—Mannava & Kang, P.C.

(57) ABSTRACT

A semiconductor memory device controls the voltage level of an equalization signal to be a boost voltage VPP for a predetermined time period and then to be an external power supply voltage VDD, when the equalization signal is repeated by a repeater. In order to improve bit line precharging performance of the bit line precharge portion enabled by the equalization signal, a rising interval of the equalization signal is activated as the boost voltage. Precharging is then performed with the external supply voltage after a predetermined time period. Thus, a thin gate insulating membrane can be used in a transistor in the bit line precharge portion which receives the equalization signal can be formed.

16 Claims, 4 Drawing Sheets

_US 7,564,728 B2_

SEMICONDUCTOR MEMORY DEVICE AND ITS DRIVING METHOD

FIELD OF THE INVENTION

The present invention relates to semiconductor design technology, and more particularly, to a method for repeating an equalization signal of a semiconductor memory device.

DESCRPITION OF RELATED ARTS

Recent development trends in semiconductor memory devices provide large capacity and fast operating speed. In addition, it is known that low voltage or low memory power is need for reliable operation under a low supply voltage environment. Especially, a memory embedded in a portable system such as a mobile phone or a notebook computer for mobile communications, to office systems, tends to consume as little power as possible.

One of these development results is a technology for minimizing the power consumption in a cell core area of a memory. The cell core area is composed of a memory cell, bit lines and word lines, and designed based on a finely itemized design rule. Therefore, the memory cell is of a very small size and thus can use the low power.

A semiconductor device, DRAM, adopts a bit line precharge operation. The bit line precharge operation, which is followed by a data reading or data writing operation, precharges the bit lines to a predetermined voltage level before an access to data and then fits the levels of the bit lines to an input range of a sense amplifier that judges a logical state of data stored.

In addition, the DRAM is provided with an equalizer that receives an equalization signal BLEQ for maintaining the bit lines and segment input/output lines, namely, data transmission lines, to be at a constant voltage level in the precharge state.

When an active command is inputted, the equalization signal BLEQ causes the voltage levels of the bit lines and segment input/output lines that were under the precharge state to be in a floating state to thereby make the DRAM to be in a sensing state. Upon input of a precharge command, the equalization signal BLEQ serves to cause the bit lines and segment input/output lines to have a predetermined voltage level.

FIG. 1 is a circuit diagram illustrating a cell core area of a conventional semiconductor memory device.

Referring to FIG. 1, the cell core area comprises a cell array 108, a pair of bit lines BL and /BL, a sense amplifier 105, an equalizer 101 for equalizing voltage levels of the pair of bit lines BL and /BL, and a bit line precharge portion 103 for precharging the pair of bit lines BL and /BL and a pull-up line RTO of the sense amplifier driver 107 to a precharge voltage VBLP.

The equalizer 101 and the bit line precharge portion 103 are driven by the equalization signal BLEQ as set forth above.

Although there are shown in FIG. 1 the equalizer 101 and the bit line precharge portion 103 with respect to the single pair of bit lines BL and /BL, the cell array 107 proportional to the capacity of the memory exists in the cell core area and accordingly the equalizer 101 and the bit line precharge portion 103 are as many as the number proportional to the capacity of the memory.

Therefore, since the equalization signal BLEQ should enable the equalizer 101 and the bit line precharge portion 103 that exist as many as the number proportional to the capacity of the memory, a repeater is arranged to maintain a voltage level of a signal by repeating the signal in order to prevent the voltage level of the signal from being lowered.

FIG. 2 is circuit diagram illustrating an equalization signal generating circuit and repeater according to the prior art.

Referring to FIG. 2, the equalization signal generating circuit and repeater comprises a signal generator 201 for receiving an upper block selection signal LAX9A and a lower block selection signal LAXBC, which has a logic high level when an active command is input and a logic low level when a precharge command is input and generating an equalization signal BLEQ, a buffer 203 for buffering the output signal of the signal generator 201, and a repeater 205 for repeating the equalization signal BLEQ that is an output signal of the buffer 203.

This prior art equalization signal generating circuit and repeater generates and repeats the equalization signal having a voltage level of an external power supply voltage VDD. There is no defect of enabling the equalizer; but where it receives the equalization signal BLEQ and then enables the bit line pre-charge portion that precharges the bit line pair BL and /BL, it takes a long time to activate the equalization signal BLEQ of low voltage level to a logic high level. This causes the bit line precharge portion to operate slowly, thereby resulting in a slow precharging.

FIG. 3 is a circuit diagram illustrating an equalization signal generating circuit and repeater according to another prior art embodiment.

Referring to FIG. 3, the equalization signal generating circuit and repeater comprise a signal generating portion 301 for receiving an upper block selection signal LAX9A and a lower block selection signal LAXBC that have a logic high level when an active command is input and a logic low level when a precharge command is input and generating the equalization signal BLEQ, a level shifter 303 for shifting a voltage level of the output signal BLEQ from the signal generating portion 301 to a boost voltage VPP wherein the voltage level is an external power supply voltage VDD, and a repeater 305 for repeating the equalization signal BLEQ whose voltage level is the boost voltage.

This prior art equalization signal generating circuit and repeater repeats the equalization signal BLEQ having the voltage level of the boost voltage. There is no defect of enabling the equalizer; but where it receives the equalization signal BLEQ and then enables the bit line precharge portion to precharge the bit line pair BL and /BL, a thick insulating membrane of a gate of a transistor forming the bit line precharge portion is required. This is because of the reliability of the gate insulating membrane, which makes a level of a threshold voltage Vt high, current conductivity decreased and precharging performance lowered. Furthermore, due to the level shifter 303, an equalization bar signal BLEQb is also generated slowly, thereby delaying the generation of the equalization signal BLEQ.

SUMMARY OF THE INVENTION

It is, therefore, an object of the present invention to provide a semiconductor memory device and its driving method which control a voltage level of an equalization signal to enhance a precharging performance for bit lines when the equalization signal is repeated to enable a bit line precharging portion.

In accordance with an aspect of the present invention, there is provided a semiconductor memory device having a bit line sense amplifier shared by an upper cell block and a lower cell block including an equalization signal generator for generating an equalization signal in response to an upper cell block selection signal and a lower cell block selection signal; a repeater for repeating the equalization signal; and a pull-up controller for providing a first voltage as a pull-up voltage of the repeating means for a predetermined time period from a precharge time in response to the equalization signal and then providing a second voltage having a lower level than the first voltage as the pull-up voltage of the repeating means until a next activation time.

In accordance with another aspect of the present invention, there is provided a method of driving a semiconductor memory device having a bit line sense amplifier shared by an upper cell block and a lower cell block, the method including generating an equalization signal in response to an upper cell block selection signal and a lower cell block selection signal; creating a driver control pulse being activated for a predetermined time period from a precharge time in response to the equalization signal; driving a pull-up voltage stage of a repeater that repeats the equalization signal using a first voltage for a predetermined time period from the precharge time in response to the driver control pulse; and driving the pull-up voltage stage of the repeater from an inactivation time of the driver control pulse to a next activation time with a second voltage having a lower level than the first voltage in response to the driver control pulse.

More specifically, when the equalization signal is repeated by the repeater, the present invention controls a voltage level of the equalization signal to be a boost voltage VPP for a predetermined time period and then to be an external power supply voltage VDD. Namely, in order to improve the bit line precharging performance of the bit line precharge portion enabled by the equalization signal, a rising interval of the equalization signal is activated as the boost voltage. Precharging is then performed with the external supply voltage after a predetermined time period. Thus, a thin gate insulating membrane can be used in a transistor in the bit line precharge portion which receives the equalization signal.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, preferred embodiments of the present invention will be described in detail referring to the accompanying drawings so that the invention can be readily conceived by those in the art to which the invention pertains.

Figure 4:
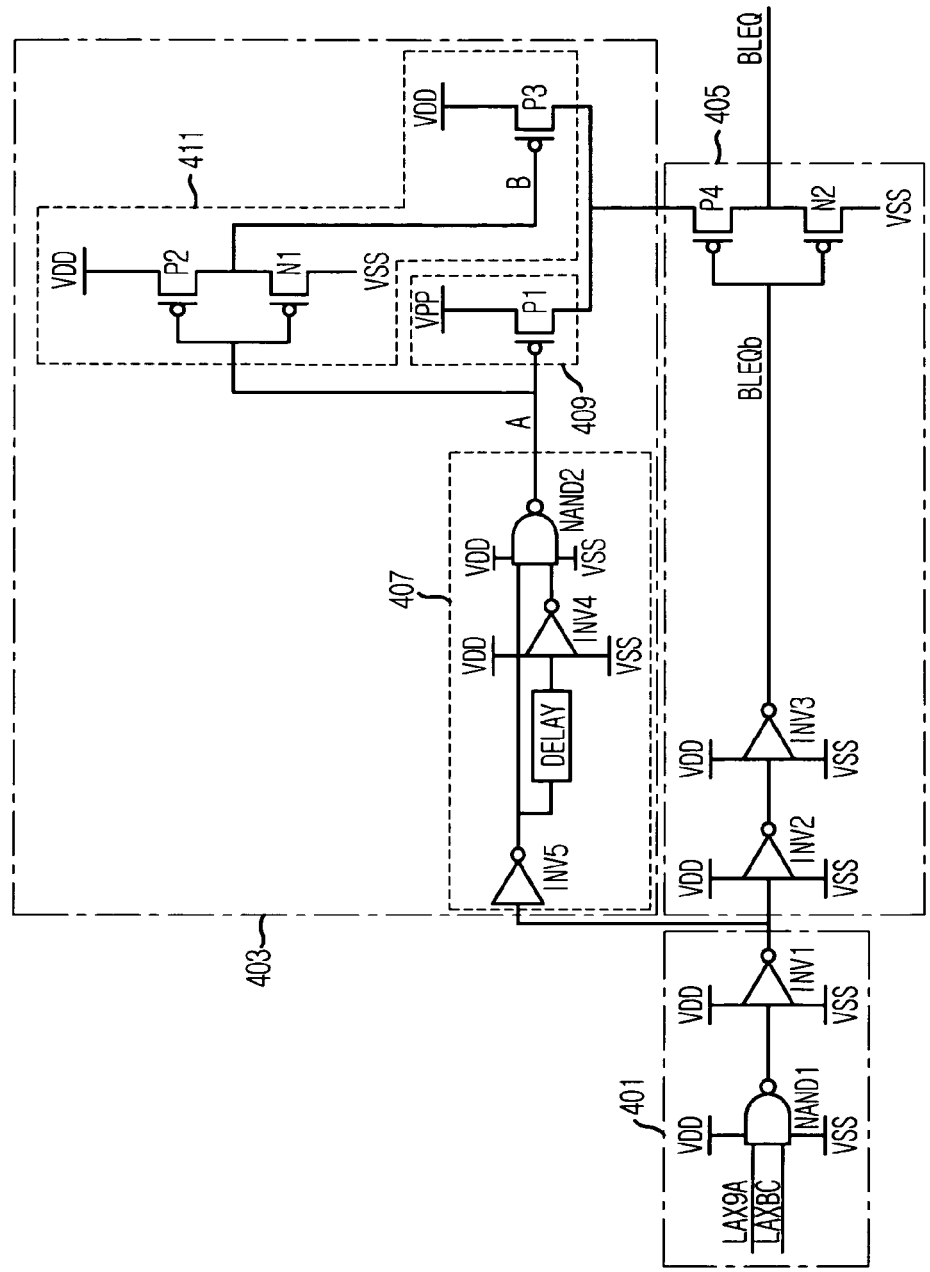
FIG. 4 is a circuit diagram illustrating an equalization signal generating circuit and repeater in accordance with an embodiment of the present invention.

FIG. 4 is a circuit diagram illustrating an equalization signal generating circuit and repeater in accordance with an embodiment of the present invention.

Referring to FIG. 4, the invention equalization signal generating circuit and repeater comprise a signal generator 401 for receiving an upper block selection signal LAX9A and a lower block selection signal LAXBC that have a logic high level when an active command is inputted and a logic low level when a pre-charge command is inputted and generating an equalization signal BLEQ, a repeater pull-up voltage source 403 for controlling a voltage level of the equalization signal BLEQ to be at a boost voltage VPP at first and to be an external power supply voltage VDD after a predetermined time period, and a repeater 405 for taking the equalization signal BLEQ that is the output of the signal generator 401 and then repeating the equalization signal BLEQ corresponding to a voltage level of an output signal of the pull-up voltage source 403.

At this time, the signal generating portion 401 can be implemented with a NAND gate NAND1 for receiving the upper block selection signal LAX9A and lower block selection signal LAXBC and outputting the equalization signal BLEQ, and a first inverter INV1 for inverting an output signal of the NAND gate NAND1.

The repeater pull-up voltage source 403 can be implemented with a pulse generator 407 for generating a driver control pulse A being activated for a predetermined time period from a precharge time in response to the output signal BLEQ of the signal generator 401, an over-driver 409 for driving the pull-up voltage source 403 in the repeater with a boost voltage for the predetermined time period from the precharge time in response to the driver control pulse A, and a normal driver 411 for driving the pull-up voltage source 403 in the repeater with the supply voltage from an inactivation time of the driver control pulse A to a next activation time wherein the supply voltage is lower than the boost voltage.

At this time, the pulse generator 407 can be implemented with a fifth inverter INV5 for inverting the output signal of the signal generator 401, a delay DELAY for delaying an output signal of the fifth inverter INV5, a fourth inverter INV4 for inverting an output signal of the delay DELAY, and a second NAND gate NAND2 for NAND-operating the output signal of the signal generator 401 and an output signal of the fourth inverter INV4.

The over-driver 409 can be implemented with a first PMOS transistor P1 connected to a boost voltage stage and having an output signal of the second NAND gate NAND2 as its gate input.

The normal driver 411 can be implemented with a PMOS transistor P3 connected to a supply voltage stage and having the driver control pulse A inverted in a previous stage as its gate input.

The repeater 405 can be implemented with a second inverter INV2 and a third inverter INV3 for buffering the output signal of the signal generator 401, and a fourth PMOS transistor P4 and a second NMOS transistor N2 for receiving an equalization bar signal BLEQb that is an output signal of the third inverter INV3 via its gate.

Figure 5:
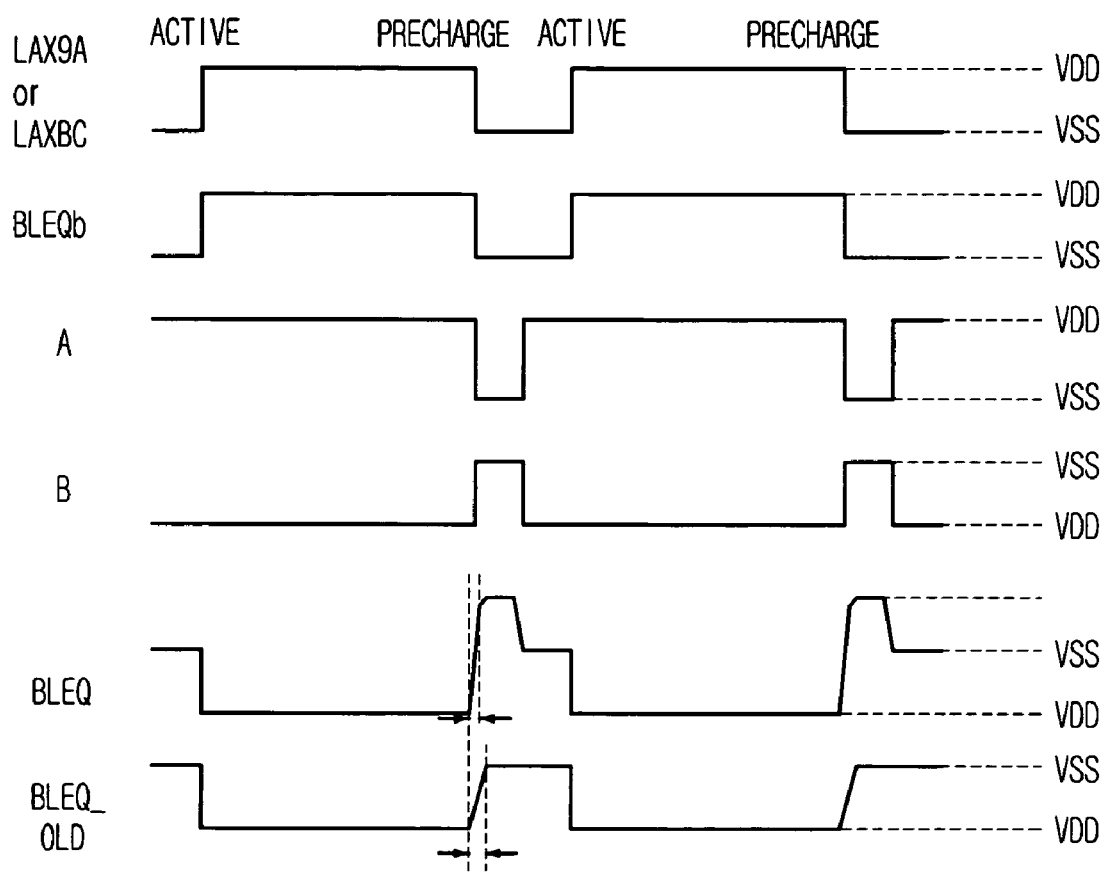
FIG. 5 is a timing diagram for describing the operation of the equalization signal generating and repeater shown in FIG. 4.

FIG. 5 is a timing diagram for describing an operation of the equalization signal generating circuit and repeater of FIG. 4. The detailed description thereof that follows recites the reference characters of FIG. 4.

Referring to FIG. 5, with the upper block selection signal LAX9A and lower block selection signal LAXBC, the equalization bar signal BLEQb that is the output signal of the signal generator 401 has the same logic level as the upper block selection signal LAX9A and lower block selection signal LAXBC.

Thereafter, the driver control pulse A that is the output signal of the pulse generator 407 is generated by the equalization bar signal BLEQb delayed as much as delay information of the delay DELAY. The driver control pulse A is activated to a logic low level corresponding to a falling edge of the equalization bar signal BLEQb.

In other words, the equalization signal BLEQ begins to rise, namely, to be repeated, by the equalization bar signal BLEQb that is the output signal of the signal generator 401. The first PMOS transistor P1 in the over-driver 409 is then turned on by the output signal A of the pulse generator 407. Accordingly, the equalization signal BLEQ rises to the boost voltage VPP.

Successively, the output signal A of the pulse generator 407 is inactivated as a logic high level and simultaneously a signal B input to the third PMOS transistor P3 is activated as a logic low level. Correspondingly, a voltage level of the equalization signal BLEQ becomes the external supply voltage VDD.

In other words, when enabling the bit line precharge portion by repeating the equalization signal BLEQ, an equalization signal input transistor in the bit line precharge portion is over-driven by the boost voltage VPP for a predetermined initial time period and then normally driven by the external supply voltage VDD. Here, the predetermined initial time period is determined by delay information of the delay DEALY in the pulse generator 407.

Figure 1:
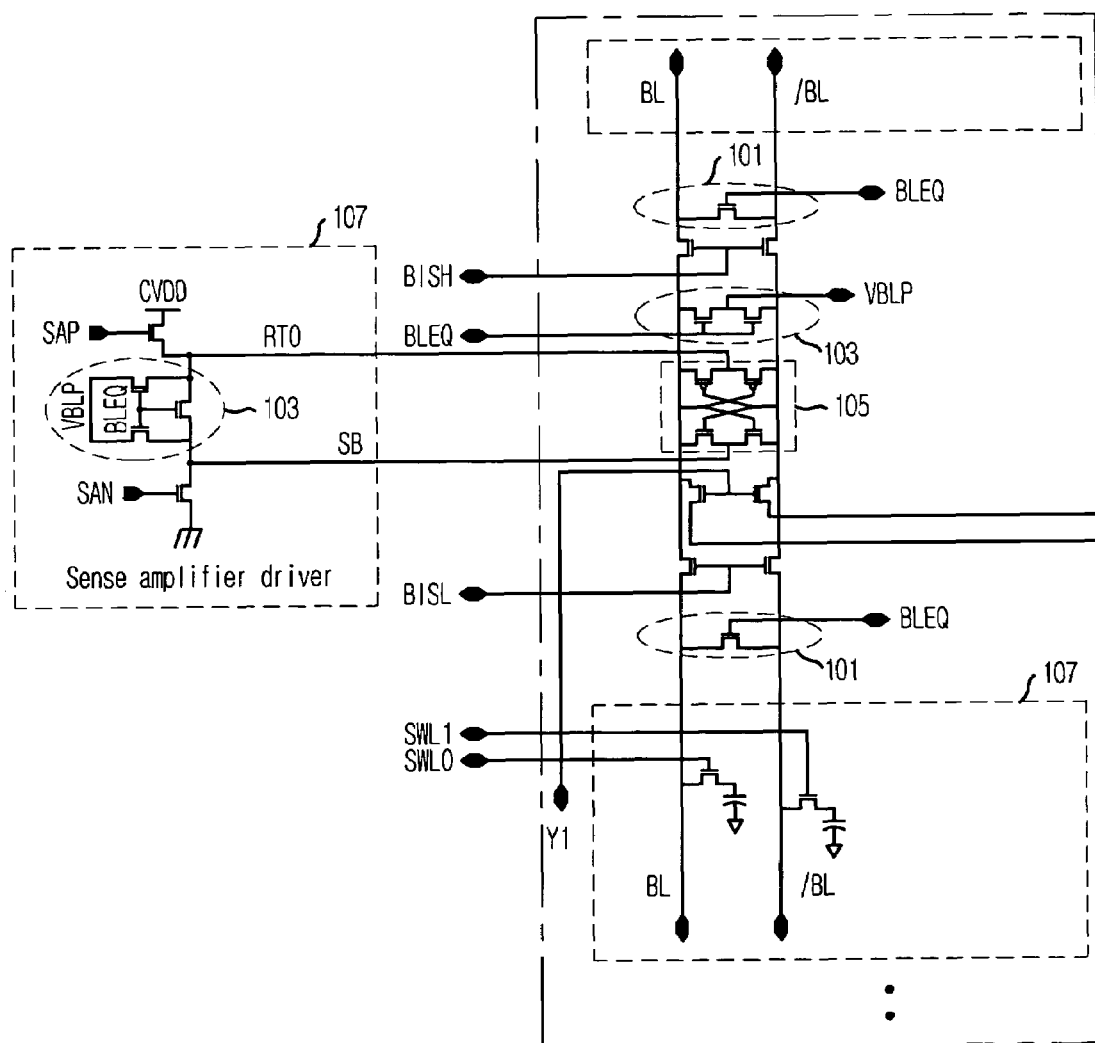
FIG. 1 is a circuit diagram illustrating a cell core area of a conventional semiconductor memory device.
Figure 2:
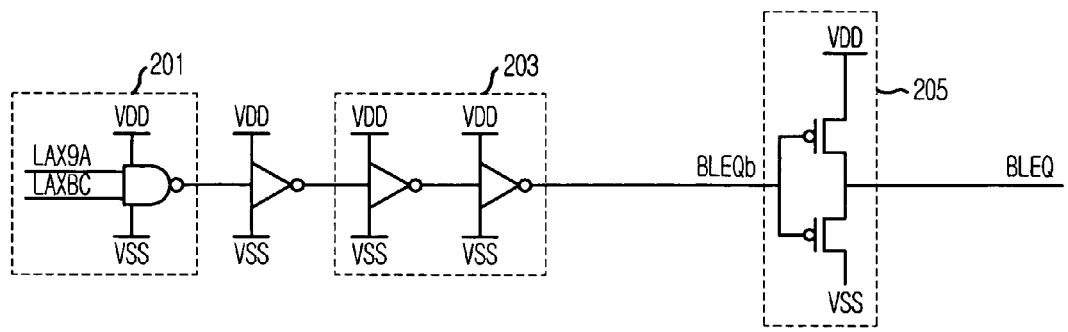
FIG. 2 is a circuit diagram illustrating an equalization signal generating circuit and repeater according to the prior art.
Figure 3:
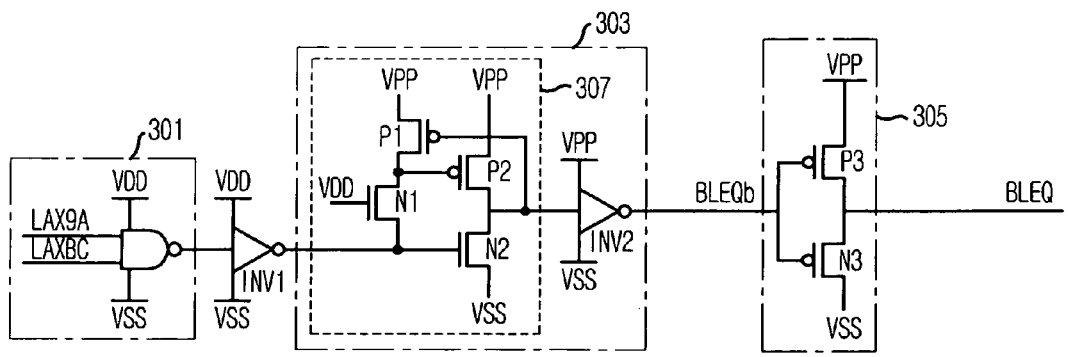
FIG. 3 is a circuit diagram illustrating an equalization signal generating circuit and repeater according to another prior art.

The above-described time period can be precisely known from the logic level of the equalization signal BLEQ. It can be also noted that a rising time of the equalization signal BLEQ to a logic high level differs deterministically from that of the conventional equalization signal BLEQ_OLD as shown in FIG. 1.

As described above, there are two problems. One of them is that the turn-on time of the equalization signal input transistor in the bit line precharge portion becomes long due to a low voltage level of the equalization signal BLEQ, when the equalization signal BLEQ is repeated to drive the equalization signal input transistor by the conventional repeater. The other is the thick gate insulating membrane of the transistor due to a high voltage level of the equalization signal BLEQ. In order to overcome the two problems, the present invention comprises the equalization signal input transistor having a thin gate insulating membrane in the bit line pre-charge portion. In this arrangement, a voltage level of the equalization signal BLEQ repeated by the repeater of the present invention causes the transistor to over-drive, thereby improving the precharging speed. When the equalization signal BLEQ goes up to a logic high level, it has the level of the boost voltage VPP and thereafter the level of the external supply voltage VDD. Consequently, the rising time of the equalization signal BLEQ is decreased.

The logic types and arrangements employed in the above-described embodiments are exemplified with respect to the input and output signals having only high activation signals. Therefore, when their activation polarities are changed, the logic implementation should be also changed accordingly. The present invention can be embodied in various ways and modifications of the embodiments can also be technically easily deduced by those skilled in the art. Thus, a detailed description of each case is omitted here.

In addition, it is also only exemplified but not restrictive that the signal generator 401, the repeater pull-up voltage source 403 and the repeater 405 are implemented with a plurality of logics.

As mentioned above, the present invention allows the use of the thin gate insulating membrane in the equalization signal input transistor of the bit line precharge portion by controlling the voltage level of the equalization signal to be the boost voltage VPP for a predetermined time period and then to be the external supply voltage when the equalization signal is repeated by the repeater, and activates the rising interval of the equalization signal with the boost voltage. As a result, the present invention can improve precharging speed and accordingly precharge time tRP.

The present application contains subject matter related to Korean patent application No. 2005-91675 and No. 2005-134012, filed with the Korean Intellectual Property Office on Sep. 29, 2005 and on Dec. 29, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having a bit line sense amplifier shared by an upper cell block and a lower cell block, comprising:

an equalization signal generating unit for generating an equalization signal in response to an upper cell block selection signal and a lower cell block selection signal; and a pull-up controlling unit for providing a first voltage as a pull-up voltage of the equalization signal generating unit for an initial period and then providing a second voltage having a lower level than the first voltage as the pull-up voltage after a predetermined time period, wherein the equalization signal generating unit includes a signal generating unit for generating a reference signal, according to the upper cell block selection signal and the lower cell block selection signal, to the pull-up controlling unit.

2. The semiconductor memory device as recited in claim 1, wherein the first voltage is a boost voltage and the second voltage is a power supply voltage.

3. A method of driving a semiconductor memory device having a bit line sense amplifier shared by an upper cell block and a lower cell block, the method comprising:

generating an equalization signal in response to an upper cell block selection signal and a lower cell block selection signal;

creating a driver control pulse being activated for an initial period in response to the equalization signal;

driving a pull-up voltage terminal for generating the equalization signal to the level of a first voltage for the initial period in response to the driver control pulse; and driving the pull-up voltage terminal to the level of a second voltage having a lower level than the first voltage after a predetermined time period in response to the driver control pulse.

4. The method as recited in claim 3, wherein the first voltage is a boost voltage and the second voltage is a power supply voltage.

5. A semiconductor memory device having a bit line sense amplifier shared by an upper cell block and a lower cell block, comprising:

an equalization signal generating unit for generating an equalization signal in response to an upper cell block selection signal and a lower cell block selection signal; and a voltage provider for providing the equalization signal generating unit with an operational voltage, wherein the voltage provider provides the equalization signal generating unit with a first voltage for an initial period and then provides a second voltage having a lower level than the first voltage after a predetermined time period and includes:

a repeating unit for repeating the equalization signal; and a pull-up controlling unit for providing the repeating unit with the first and second voltages in response to the equalization signal.

6. The semiconductor memory device as recited in claim 5, wherein the pull-up controlling unit provides the repeating unit with the first voltage as a pull-up voltage for the initial period and then providing the second voltage as the pull-up voltage after a predetermined time period, in response to the equalization signal.

7. The semiconductor memory device as recited in claim 1, wherein the equalization signal generating unit further includes a repeating unit for repeating the reference signal to output the equalization signal.

8. The semiconductor memory device as recited in claim 7, wherein the signal generating unit includes:

a NAND gate for taking and NAND-operating the upper cell block selection signal and the lower cell block selection signal; and an inverter for inverting an output signal of the NAND gate.

9. The semiconductor memory device as recited in claim 7, wherein the repeating unit includes:

a buffer for buffering an output signal of the signal generating unit; and

NMOS and PMOS transistors for receiving an output signal of the buffer via gates and outputting the equalization signal.

10. The semiconductor memory device as recited in claim 5, wherein the pull-up controlling unit includes:

a pulse generating unit for generating a driver control pulse being activated during the initial period in response to the output of the signal generating unit;

an over-driving unit for driving a pull-up voltage terminal of the equalization signal generating unit using the first voltage in response to the driver control pulse; and a normal driving unit for driving the pull-up voltage terminal with the second voltage in response to the drive control pulse.

11. The semiconductor memory device as recited in claim 10 wherein the pulse generating unit includes:

a first inverter for inverting an output signal of the signal generating unit;

a delay for delaying an output signal of the first inverter;

a second inverter for inverting an output signal of the delay; and a NAND gate for receiving and NAND-operating an output signal of the second inverter and the output signal of the first inverter.

12. The semiconductor memory device as recited in claim 10, wherein the over-driving unit includes a PMOS transistor connected between a boost voltage terminal and the pull-up voltage terminal for receiving the driver control pulse through a gate.

13. The semiconductor memory device as recited in claim 10, wherein the normal driving unit includes:

an inverter for inverting the driver control pulse; and a PMOS transistor, connected between a power supply voltage terminal and the pull-up voltage terminal, for receiving an output signal of the inverter through a gate.

14. The semiconductor memory device as recited in claim 5, wherein the initial period is an initial time of a precharge period.

15. The method as recited in claim 3, wherein the initial period is an initial time of a precharge period.

16. The semiconductor memory device of claim 1, wherein the pull-up control unit provides the first voltage as a pull-up voltage of the equalization signal generating unit for an initial period and then provides the second voltage as the pull-up voltage after a predetermined time period, whereby the equalization signal has a third voltage level during the initial period and has a fourth voltage level lower than the third voltage level after the predetermined time period.

* * * * *